US009261193B2

(12) United States Patent
Yudovsky

(10) Patent No.: US 9,261,193 B2
(45) Date of Patent: Feb. 16, 2016

(54) SEALING APPARATUS FOR A PROCESS CHAMBER

(71) Applicant: APPLIED MATERIALS, INC., Santa Clara, CA (US)

(72) Inventor: Joseph Yudovsky, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 135 days.

(21) Appl. No.: 13/800,750

(22) Filed: Mar. 13, 2013

(65) Prior Publication Data

US 2013/0192756 A1 Aug. 1, 2013

Related U.S. Application Data

(63) Continuation of application No. 12/270,559, filed on Nov. 13, 2008, now abandoned.

(51) Int. Cl.

| | |
|---|---|
| ***F16J 15/00*** | (2006.01) |
| ***F16J 15/02*** | (2006.01) |
| ***F16J 15/10*** | (2006.01) |
| *H01L 21/67* | (2006.01) |

(52) U.S. Cl.

CPC ................ *F16J 15/02* (2013.01); *F16J 15/025* (2013.01); *F16J 15/106* (2013.01); *H01L 21/67126* (2013.01); *H01L 21/67109* (2013.01)

(58) Field of Classification Search

CPC ......... F16J 15/3272; F16J 15/02; F16J 15/00; C23C 16/46; H01L 21/67109

See application file for complete search history.

(56) References Cited

U.S. PATENT DOCUMENTS

| | | | | |
|---|---|---|---|---|
| 3,106,406 A * | 10/1963 | Liebig | ........................... | 277/546 |
| 3,700,296 A | 10/1972 | Bugmann | | |
| 4,907,811 A | 3/1990 | Nash et al. | | |
| 5,172,917 A | 12/1992 | du Gay | | |
| 5,248,069 A | 9/1993 | Consaga et al. | | |
| 5,292,137 A | 3/1994 | Simmons et al. | | |
| 5,423,557 A | 6/1995 | De Villepoix et al. | | |
| 5,597,168 A | 1/1997 | Antonini | | |
| 5,749,586 A | 5/1998 | Abe et al. | | |

(Continued)

FOREIGN PATENT DOCUMENTS

| | | |
|---|---|---|
| CN | 201003609 Y | 1/2008 |
| JP | 56-070247 U | 6/1981 |
| JP | 2006-035872 | 2/2006 |

OTHER PUBLICATIONS

Search Report received Aug. 14, 2013 from The State Intellectual Property Office of the People's Republic of China for Chinese National Phase Application No. 200980145540.6.

(Continued)

*Primary Examiner* — Vishal Patel

(74) *Attorney, Agent, or Firm* — Moser Taboada; Alan Taboada

(57) ABSTRACT

A sealing apparatus is provided herein. In some embodiments, the sealing apparatus includes an annular body including a first portion having a circular cross-section and a second portion extending radially outward from the first portion, wherein the second portion has a rectangular cross-section. In some embodiments, a sealing apparatus includes a body configured to be retained in a recess of a first surface; an arm extending from the body away from the first surface and configured to provide a force when deflected towards the body by a second surface to form a seal between the first surface and the second surface.

18 Claims, 6 Drawing Sheets

(56) References Cited

U.S. PATENT DOCUMENTS

| | | | | |
|---|---|---|---|---|
| 6,273,231 | B1 | 8/2001 | Koschmieder et al. | |
| 6,364,152 | B1 * | 4/2002 | Poslinski et al. | 220/788 |
| 6,548,163 | B1 | 4/2003 | Hills | |
| 6,551,282 | B1 | 4/2003 | Exline et al. | |
| 7,137,790 | B2 | 11/2006 | Youn et al. | |
| 7,285,195 | B2 | 10/2007 | Herchen et al. | |
| 7,413,099 | B2 | 8/2008 | Takahashi et al. | |
| 2002/0195455 | A1 * | 12/2002 | Takahashi et al. | 220/806 |
| 2003/0010640 | A1 | 1/2003 | Kholodenko | |
| 2005/0242571 | A1 | 11/2005 | Houghton et al. | |
| 2005/0284754 | A1 * | 12/2005 | Herchen et al. | 204/297.01 |
| 2006/0006612 | A1 | 1/2006 | Durfield et al. | |
| 2006/0156979 | A1 | 7/2006 | Thakur et al. | |
| 2006/0249512 | A1 | 11/2006 | Ueda et al. | |
| 2007/0084406 | A1 | 4/2007 | Yudovsky et al. | |
| 2007/0084408 | A1 * | 4/2007 | Yudovsky et al. | 118/725 |
| 2007/0210533 | A1 * | 9/2007 | Okabe et al. | 277/628 |
| 2008/0029972 | A1 | 2/2008 | Smathers et al. | |

OTHER PUBLICATIONS

International Search Report and Written Opinion mailed Jun. 18, 2010 for PCT Application No. PCT/US2009/064332.

* cited by examiner

SEALING APPARATUS FOR A PROCESS CHAMBER

CROSS-REFERENCE TO RELATED APPLICATIONS

This application is a continuation of co-pending U.S. patent application Ser. No. 12/270,559, filed Nov. 13, 2008, which is herein incorporated by reference.

FIELD

Embodiments of the present invention generally relate to vacuum process chambers, and more specifically, to seals for such process chambers.

BACKGROUND

Typically, leaks are prevented in joints formed between surfaces by including a gasket, o-ring, or similar type of seal disposed between the surfaces to be adjoined. The adjoining surfaces may be pressed against each other with a force sufficient to compress the seal and prevent the flow of gases through the sealed joint. In some processes, however, fragile components, such as a quartz bell jar, must be mated with exhaust components, such as an exhaust manifold, where large forces may not be applied to the seal due to the fragile components. In such cases, misalignments that may occur due to tolerances in manufacturing and/or assembly of the components may result in leaks due to variations in the force applied to the seal. Such misalignment may be exacerbated, for example, where large sealing surfaces are utilized. The tolerance variations along the sealing surface may not be suitably compensated for by applying greater pressure to the seal, due to the fragile components, as discussed above. Therefore, leaks may result due to gaps or weak contact between the seal and the sealing surface.

As such, there is need in the art for an improved seal.

SUMMARY

A sealing apparatus is provided herein. In some embodiments, the sealing apparatus includes an annular body including a first portion having a circular cross-section and a second portion extending radially outward from the first portion, wherein the second portion has a rectangular cross-section. In some embodiments, a sealing apparatus includes a body configured to be retained in a recess of a first surface; an arm extending from the body away from the first surface and configured to provide a force when deflected towards the body by a second surface to form a seal between the first surface and the second surface. Other features and embodiments of the present invention are described below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
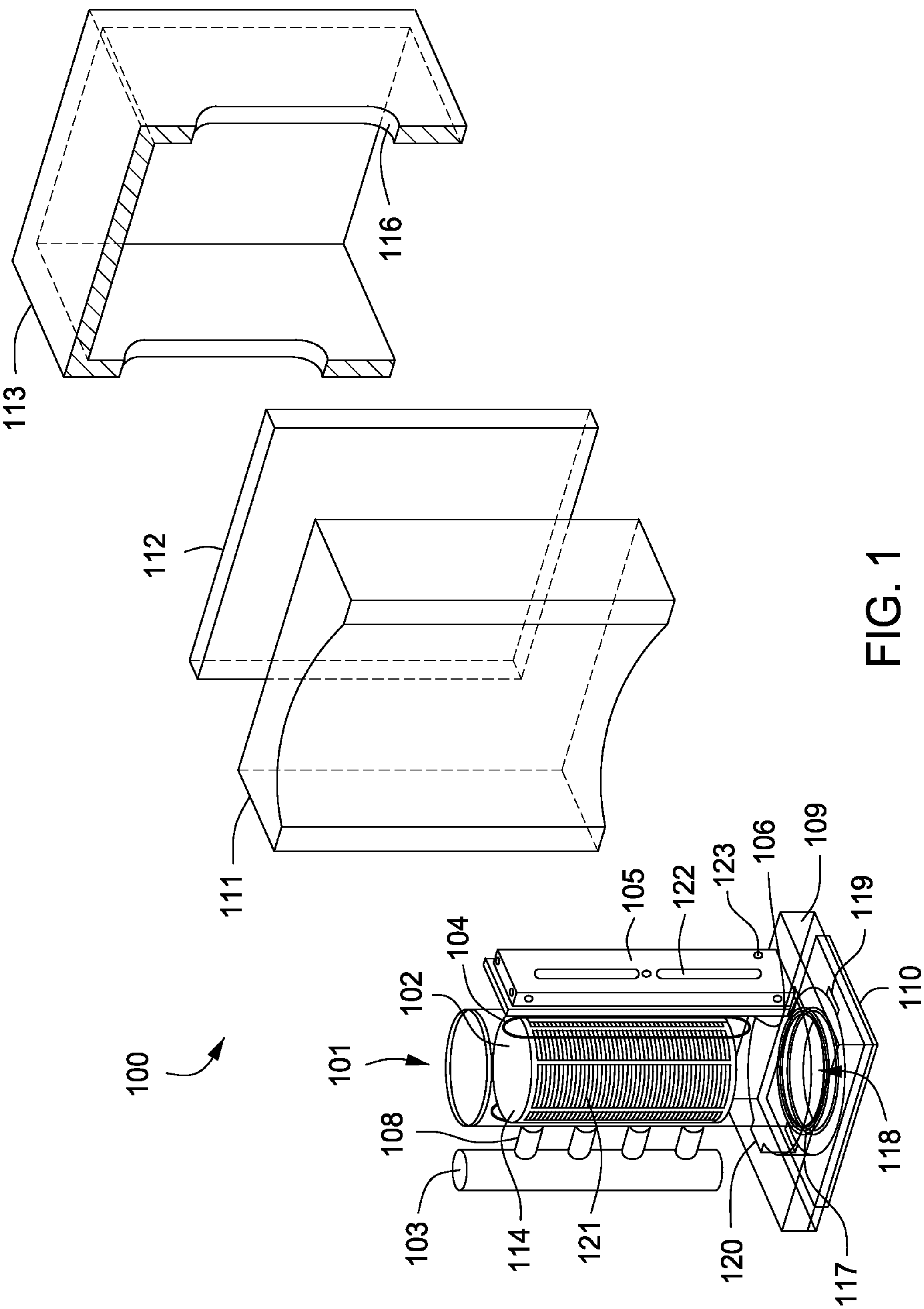
FIG. 1 depicts an exploded view of an exemplary batch processing chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of sealing apparatus are disclosed herein. In some embodiments, the inventive sealing apparatus advantageously improves tolerance to misalignment and/or non-uniformities between sealing surfaces. The inventive sealing apparatus may generally be utilized in any process chamber where a control of process pressures or process atmosphere is desired. For example, the inventive sealing apparatus may be utilized in vacuum process chambers, or in non-vacuum applications utilizing toxic gases that are to be contained. Other process chambers may also benefit from the inventive sealing apparatus, as described below.

For illustrative purposes, the inventive sealing apparatus is described below as utilized in a batch processing chamber. One exemplary batch processing chamber is illustrated below in FIGS. 1-2. Examples of suitable batch processing chambers are described in further detail in U.S. patent application Ser. No. 11/249,555, filed on Oct. 13, 2005 and entitled "Reaction Chamber with Opposing Pockets for Gas Injection and Exhaust," and U.S. patent application Ser. No. 11/381,966, filed on May 5, 2006 and entitled "Batch Processing Chamber with Diffuser Plate and Injector Assembly," each of which are incorporated herein by reference. One exemplary batch processing chamber suitable for use with the present inventive sealing apparatus may include the FLEXSTAR® system, available from Applied Materials, Inc., of Santa Clara, Calif.

FIG. 1 illustrates an exploded view of an exemplary batch processing chamber of the present invention. A batch processing chamber 100 generally comprises a quartz chamber 101 configured to accommodate a substrate boat 114. The quartz chamber 101 generally comprises a dome type of chamber body 102, an injector pocket 104 formed on one side of the chamber body 102, an exhaust assembly 103 formed on the chamber body 102 on an opposite side of the injector pocket 104, and a flange 117 formed adjacent to an opening 118 of the chamber body 102. The substrate boat 114 is configured to support and transfer a batch of substrates 121 to and from the quartz chamber 101 via the opening 118. The flange 117 may be welded on the chamber body 102 to reduce O-rings used for vacuum sealing. The exhaust assembly 103 and the injector pocket 104 may be welded in place of slots milled on the chamber body 102. The injector pocket 104 is flattened quartz tubing with one end welded on the chamber body 102 and one end open. The injector pocket 104 is configured to house an injector assembly 105. In some embodiments, the exhaust assembly 103 may comprise an exhaust port (not shown) configured to house an exhaust (not shown). As illustrated in FIG. 1, the exhaust assembly 103 comprises a quartz tube 107 coupled to the chamber body 102 via a plurality of quartz conduits 108. The quartz chamber 101 is generally made of (fused) quartz which is ideal for a furnace chamber. In one aspect, quartz is an economical material with a combination of high purity and high temperature properties. In another aspect, quartz can tolerate wide temperature gradients and high heat rates.

The quartz chamber 101 is generally supported by a support plate 110 near the opening 118. An O-ring seal 119 is used for vacuum sealing between the quartz chamber 101 and the support plate 110. A chamber stack support 109 having an aperture 120 is disposed on the support plate 110. One or more heater blocks 111 are generally disposed around the chamber body 102 and are configured to provide heat energy to the substrate 121 inside the quartz chamber 101 through the chamber body 102. In one aspect, the one or more heater blocks 111 may have multiple vertical zones. A plurality of quartz liners 112 may be disposed around the one or more heater blocks 111 to prevent heat energy from radiating outwards. An outer chamber 113 is disposed over the quartz chamber 101, the one or more heater blocks 111, and the quartz liners 112 and is rested on the stack support 109, providing vacuum sealing for the heater blocks 111 and the quartz liners 112. Openings 116 may be formed on sides of the outer chamber 113 for the injector assembly 105 and the exhaust assembly 103 to pass through. A thermal insulator 106 is generally disposed between the injector pocket 104 and the outer chamber 113. Since the thermal insulator 106 and the quartz liners 112 insulate the outer chamber 113 from the heater blocks 111 and the heated quartz chamber 101, the outer chamber 113 may stay “cool” during a heated process. Similarly, a thermal insulator (not shown) may be disposed between the exhaust 103 and the outer chamber 113 for the same purpose as the thermal insulator 106. In one aspect, the outer chamber 113 is made of metal, such as aluminum and stainless steel.

In one aspect, the injector assembly 105 and/or the exhaust assembly 103 may be temperature controlled independently from the quartz chamber 101. For example, as illustrated in FIG. 1, heater slots 122 and cooling channel 123 are provided in the injector assembly 105 for heating and cooling the injector assembly 105 independently.

Figure 2A:
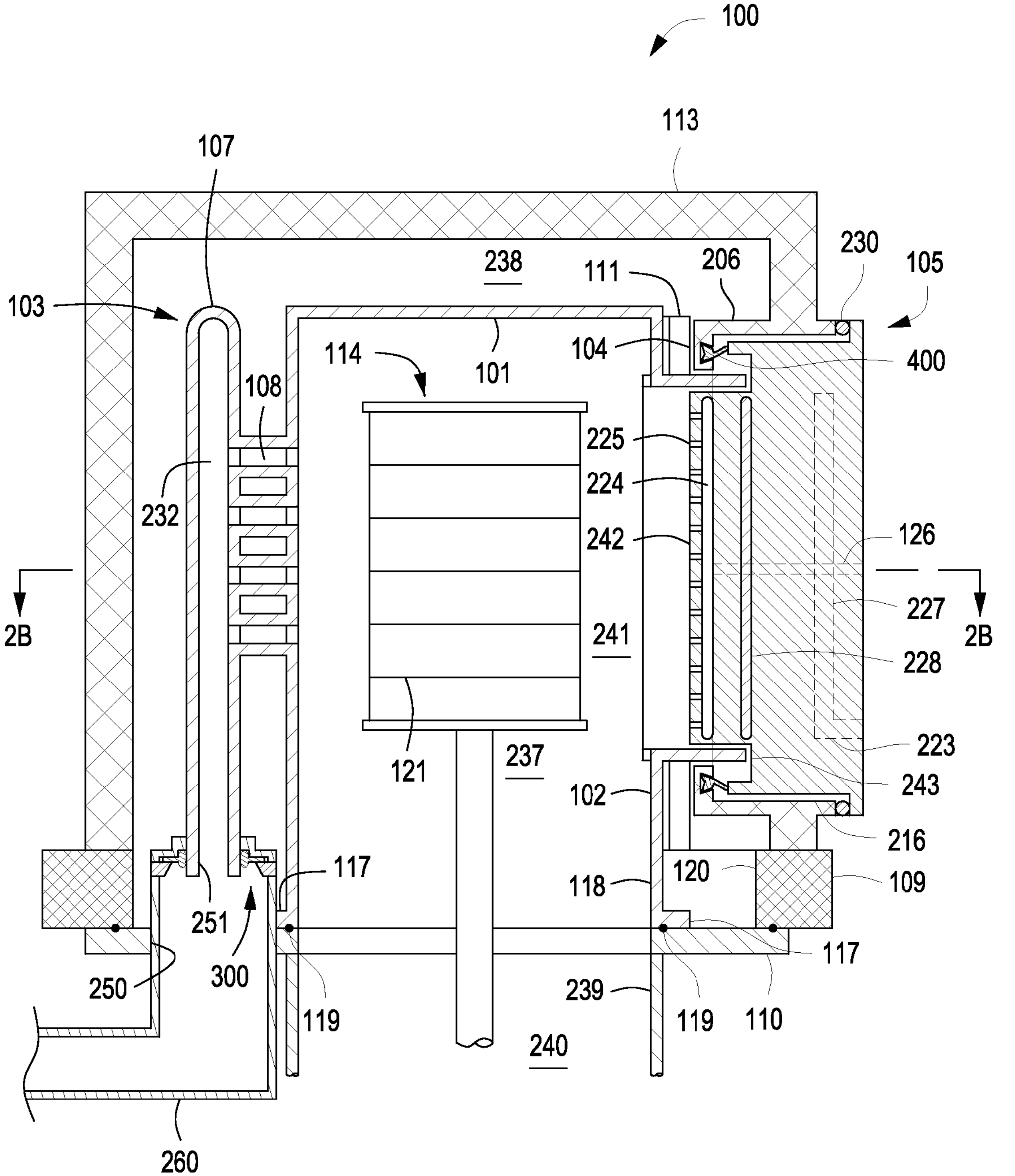
FIGS. 2A-B depicts a side view and top view of an exemplary batch processing chamber in accordance with some embodiments of the present invention.
Figure 2B:
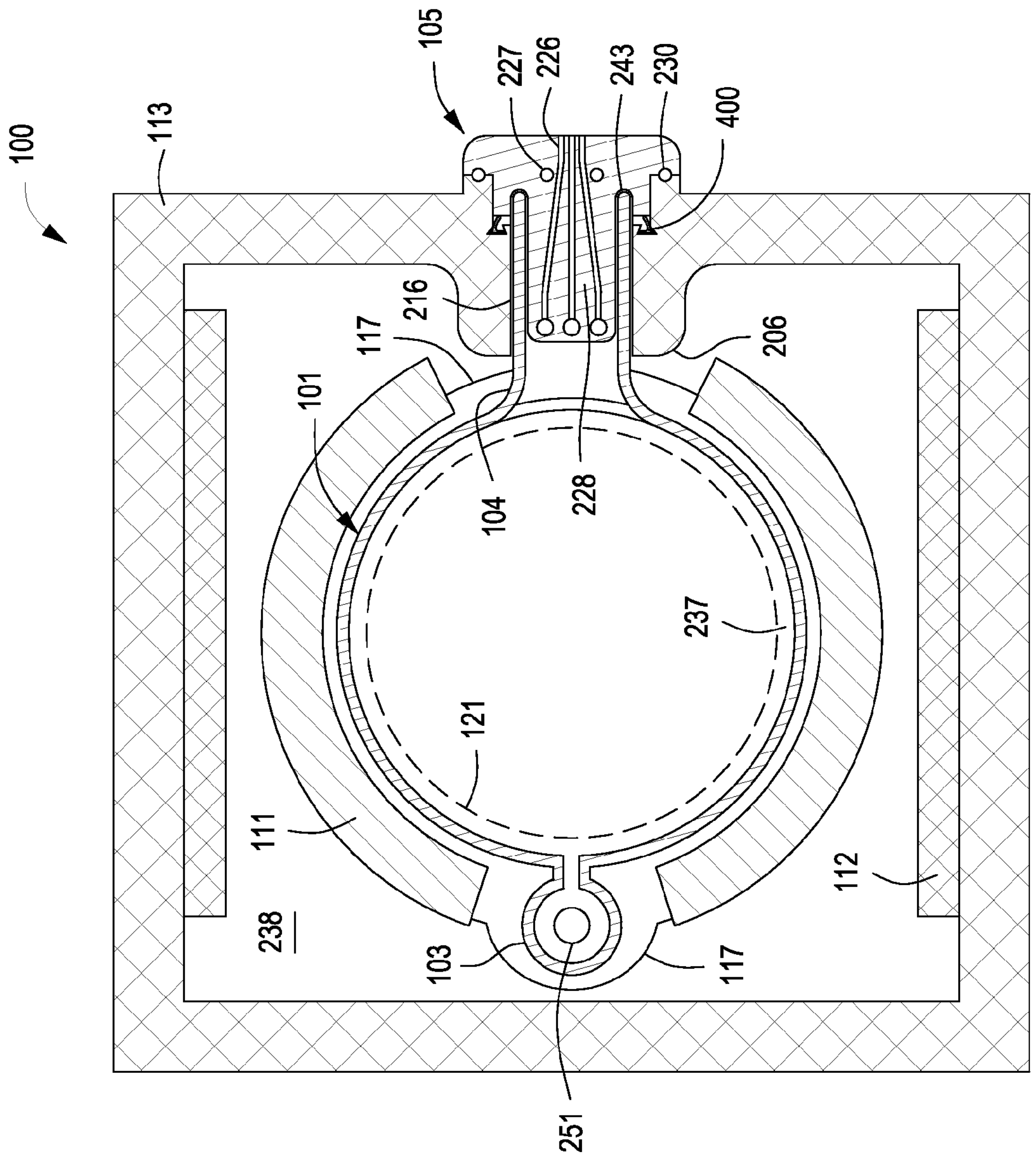

The processing chamber 100 is illustrated in further detail in FIG. 2A-B. The batch processing chamber 100 generally comprises the quartz chamber 101 defining a process volume 237 configured to accommodate a batch of substrates 121 stacked in the substrate boat 114. One or more heater blocks 111 are generally arranged around the quartz chamber 101 configured to heat the substrates 121 inside the process volume 237. The outer chamber 113 is disposed over the quartz chamber 101 and the one or more heater blocks 111. One or more quartz liners 112 are disposed between the outer chamber 113 and the one or more heater blocks 111 and are configured to keep the outer chamber 113 cool. The quartz chamber 101 is supported by the quartz support plate 110. The outer chamber 113 is connected to the chamber stack support 109 which is supported by the quartz support plate 110.

The quartz chamber 101 generally comprises the chamber body 102 having the bottom opening 118, the injector pocket 104 formed on one side of the chamber body 102, the exhaust assembly 103 formed on the chamber body 102 on an opposite side of the injector pocket 104, and the flange 117 formed adjacent to the bottom opening 118. The injector pocket 104 has a shape of a flattened quartz tubing with one end welded on the chamber body 102 and one end open. The exhaust assembly 103 comprises the quartz tube 107 welded on the chamber body 102 via the plurality of quartz conduits 108. The quartz tube 107 has a bottom port 251 and opens at the bottom. The plurality of quartz conduits 108 is configured to limit fluid communication between the process volume 237 and an exhaust volume 232 of the quartz tube 107. The flange 117 may be welded on around the bottom opening 118 and is configured to facilitate a vacuum seal for the chamber body 102. The flange 117 is generally in intimate contact with the quartz support plate 110 which has apertures 250 and 239. The bottom opening 118 aligns with the aperture 239 and the bottom port 251 empties into an exhaust manifold 260 which aligns with aperture 250. The O-ring seal 119 may be disposed between the flange 117 and the quartz support plate 110 to seal the process volume 237 from an outer volume 238 defined by the outer chamber 113, the chamber stack support 109, the quartz support plate 110 and the quartz chamber 101. A sealing apparatus 300 is disposed around the bottom port 251 to seal the exhaust volume 232 and the outer volume 238. The quartz support plate 110 is further connected to a load lock 240 where the substrate boat 114 may be loaded and unloaded. The substrate boat 114 may be vertically translated between the process volume 237 and the load lock 240 via the aperture 239 and the bottom opening 118.

The injector pocket 104 is welded on a side of the chamber body 102 and defines an inject volume 241 in communication with the process volume 237. The inject volume 241 generally covers an entire height of the substrate boat 114 when the substrate boat 114 is in a process position such that the injector assembly 105 disposed in the injector pocket 104 may provide a horizontal flow of processing gases to every substrate 121 in the substrate boat 114. In one aspect, the injector assembly 105 has an intruding center portion 242 configured to fit in the inject volume 241. A recess 243 configured to hold walls of the injector pocket 104 is generally formed around the center portion 242. The walls of the injector pocket 104 are generally wrapped around by the injector assembly 105. An injector opening 216 is formed on the outer chamber 113 to provide a pathway for the injector assembly 105. A rim 206 extending inward is formed around the injector opening 216 and is configured to shield the injector assembly 105 from being heated by the heater blocks 111. In one aspect, the outer volume 238, which generally includes inside of the outer chamber 113 and outside of the quartz chamber 101, is kept in a vacuum state. Since the process volume 237 and the injector volume 241 are usually kept in a vacuum state during process, keeping the outer volume 238 in a vacuum state can reduce pressure generated stress on the quartz chamber 101. An O-ring seal 230 is disposed between the injector assembly 105 and the outer chamber 113 to provide a vacuum seal for the inject volume 241. A sealing apparatus 400 is generally disposed outside the injector pocket 104 to prevent processing chemicals in the process volume 237 and the inject volume 241 from escaping to the outer volume 238. In another aspect, the outer volume 238 may be kept in atmospheric pressure.

Referring to FIG. 2B, three inlet channels 226 are milled horizontally across the injector assembly 105. Each of the three inlet channels 226 is configured to supply the process volume 237 with a processing gas independently. Each of the inlet channels 226 is connected to a vertical channel 224 formed near an end of the center portion 242. The vertical channels 224 are further connected to a plurality of evenly distributed horizontal holes 225 and form a vertical shower head on the center portion 242 of the injector assembly 105 (shown in FIG. 2A). During process, a processing gas first flows from one of the inlet channels 226 to the corresponding vertical channel 224. The processing gas then flows into the process volume 237 horizontally through the plurality of horizontal holes 225. In one embodiment, more or less inlet channels 226 may be formed in the injector assembly 105 depending on requirements of the process performed in the batch processing chamber 100. In another embodiment, since the injector assembly 105 may be installed and removed from outside of the outer chamber 113, the inject assembly 105 may be interchangeable to satisfy different needs.

Referring to FIG. 2A, one or more heaters 228 are disposed inside the injector assembly 105 adjacent to the inlet channels 226. The one or more heaters 228 are configured to heat the injector assembly 105 to a set temperature and may be made of resistive heater elements, heat exchangers, etc. Cooling channels 227 are formed in the injector assembly 105 outside the one or more heaters 228. In one aspect, the cooling channels 227 provide further control of the temperature of the injector assembly 105. In another aspect, the cooling channels 227 keep an outside surface of the injector assembly 105 cool. In one embodiment, the cooling channels 227 may comprise two vertical channels drilled slightly in an angle so that they meet on one end. Horizontal inlet/outlet 223 is connected to each of the cooling channels 227 such that a heat exchanging fluid may continually flow through the cooling channels 227. The heat exchanging fluid may be, for example, a perfluoropolyether (e.g., Galden® fluid) that is heated to a temperature between about 30° C. and about 300° C. The heat exchanging fluid may also be chilled water delivered at a desired temperature between about 15° C. to 95° C. The heat exchanging fluid may also be a temperature controlled gas, such as, argon or nitrogen.

The exhaust volume 232 is in fluid communication with the process volume 237 via the plurality of quartz conduits 108. The exhaust volume 232 is in fluid communication with pumping devices (not shown) through the exhaust manifold 260 coupled to the bottom port 251 via a sealing apparatus 300. Therefore, processing gases in the process volume 237 flow into the exhaust volume 232 through the plurality of quartz conduits 108, then go down to the bottom port 251 and empty into the exhaust manifold 260. The conduits 108 located near the bottom port 251 may have a stronger draw than the conduits 108 located away from the bottom port 251. To generate an even draw from top to bottom, sizes of the plurality of quartz conduits 108 may be varied (not shown), for example, by increasing the size of the conduits 108 from bottom to top.

Figure 3A:
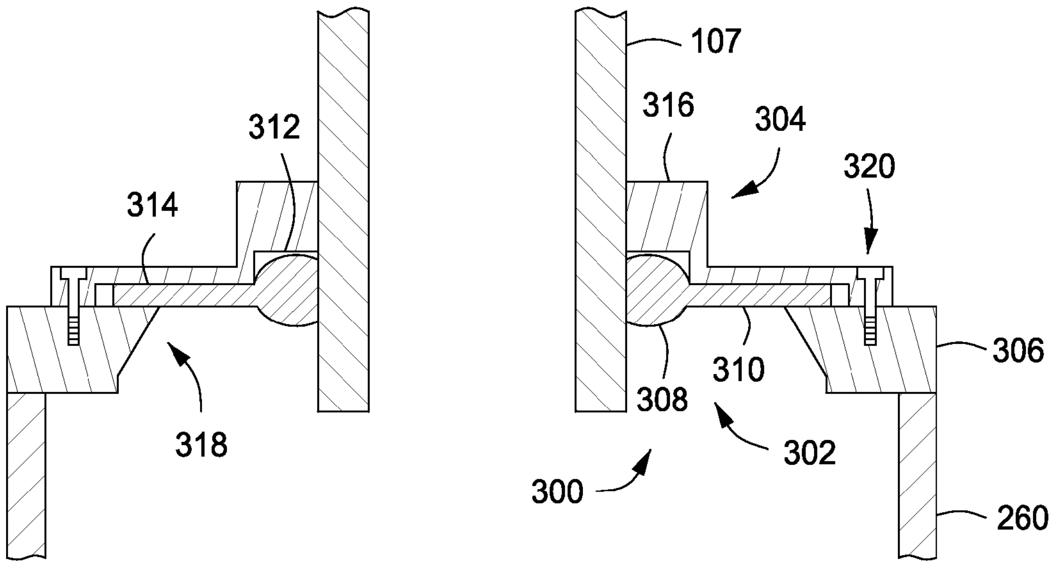
FIGS. 3A-B depict a sealing apparatus in accordance with some embodiments of the present invention.
Figure 3B:
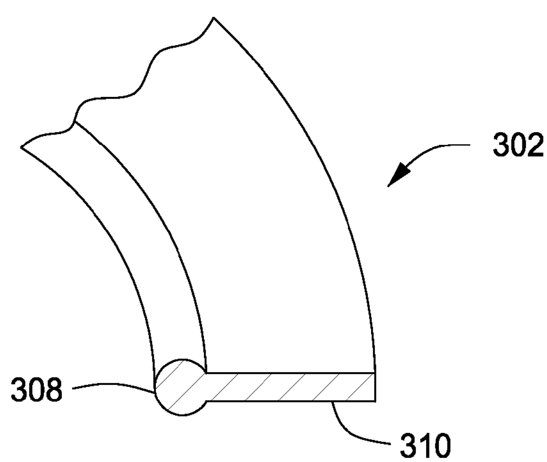

The sealing apparatus 300 which couples the exhaust assembly 103 to the exhaust manifold 260 proximate the bottom port 251 of the quartz tube 107 is depicted in further detail in FIGS. 3A-B. The sealing apparatus 300 generally may include an annular body 302 configured to be disposed between a first flange 304 and a second flange 306. The first flange 304 may be coupled to, and/or may be disposed about the quartz tube 107 proximate the bottom port 251. The second flange 306 may be coupled to the exhaust manifold 260. The sealing apparatus 300 may be advantageously configured to compensate for misalignment between the quartz tube 107 and the exhaust manifold 260 during initial coupling via the sealing apparatus 300, or during processes where movement may occur. For example, the quartz tube 107 may slide relative to the exhaust manifold 260 and/or expand during substrate processing creating a misalignment.

The annular body 302 may be fabricated from a suitable process-compatible flexible material. Examples of suitable materials include perfluoroelastomers, such as KALREZ® or PERLAST®, commercially available from DuPont Performance Elastomers and Perlast Ltd., respectively. The annular body 302 includes a first portion 308 and a second portion 310. The first portion 308 is disposed about, and contacts, the outer wall of the quartz tube 107 and forms a seal therewith. For example the first portion 308 may have an inner diameter that is less than an outer diameter of the quartz tube 107. The first portion 308 may have a circular cross-section as illustrated in FIGS. 3A-B. However, other cross-sections having a curved surface may also be utilized.

The second portion 310 extends radially outward from the first portion 308 and is configured to be secured between the first flange 304 and the second flange 306 and forming a seal therebetween. The second portion 310 may have a rectangular cross-section as illustrated in FIGS. 3A-B. However, other suitable cross-sections may also be utilized, such as wedge-shaped cross-sections, or the like. In some embodiments, the cross-section of the second portion 310 may be any suitable shape such that a terminal end of the second portion may be partially immobilized between the first and second flanges 304 and 306.

The first flange 304 may have any suitable shape necessary to conform to the shape of the annular body 302 and quartz tube 107. For example, the first flange 304 may include a first recess 312 and a second recess 314. The first recess 312, disposed proximate the quartz tube 107, is configured for fitting partially around the first portion 308 of the annular body 302. The second recess 314, disposed radially outward from the first recess 314, is configured for fitting partially around the second portion 310 of the annular body 302. In some embodiments, the first flange 304 may further comprise a lip 316 for shielding the annular body 302 from, for example, heat that may emanate from the process chamber. The lip 316 may be disposed proximate a radially inward side of the first flange 304 adjacent to the quartz tube 107. The first flange 304 may be secured to the second flange 306 by any suitable means, for example, such as by clamps, screws or the like (bolts 320 shown). In some embodiments, the first flange 304 may be secured to the second flange 306 without passing through the second portion 310 of the annular body 302, thereby minimizing the deformation, wear, or risk of premature failure of the annular body 302. For example, the first flange 304 may be secured to the second flange 306 using bolts 320 disposed radially outward of the second portion 310.

The second flange 304 may have any suitable shape necessary to mate with the first flange 304 and with the second portion 310 of the annular body 302. The second flange 306 is configured for securing the second portion 310 of the annular body 302 when coupled to the first flange 304. As depicted in FIG. 3A, the second portion 310 is contacted by the second flange 306 proximate a terminal end of the second portion 310. In some embodiments, the second flange 306 is configured to contact only the second portion 310 of the annular body 302 and allows the first portion 308 of the annular body 302 to move freely. Thus, the second flange 306 may have a smaller radial width as compared to the first flange 304 to provide a gap 318 between the quartz tube 107 and an interior edge of the second flange 306.

The gap 318 is generally disposed below the annular body 302 and facilitates movement of the annular body 302 into the gap 318 during, for example, a sliding motion of the quartz tube 107 (such as during assembly). As depicted in FIG. 3A, the gap 318 is disposed below the first portion 308 and part of the second portion 310 may be free to move as well (e.g., the part of the second portion 310 is not immobilized between the first and second flanges 304, 306). The gap 318 may have any suitable width to facilitate movement of the annular body 302 within the gap 318 during motion of the quartz tube 107, for example, during assembly.

The first and second flanges 304, 306 may comprise any suitable materials having the desired thermal and/or structural properties necessary for use in the sealing apparatus 300. In some embodiments, the first and/or the second flange 304, 306 may comprise stainless steel, aluminum (including alloys thereof), or the like. The second flange 306 may be fabricated from the same or different materials as the first flange 304. In some embodiments, the first flange 304 may be fabricated from a materials having low thermal conductivity, such as ceramics, to thermally isolate the seal (e.g., the annular body 302) from the heater (discussed above with respect to FIG. 1). Examples of suitable materials include alumina ($Al_2O_3$), or the like.

Figure 4A:
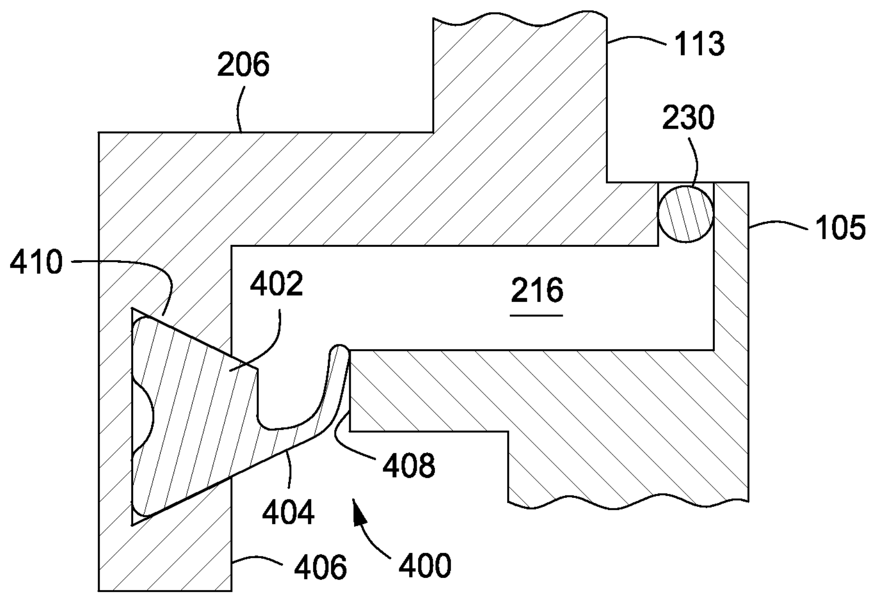
FIGS. 4A-D depict a sealing apparatus in accordance with some embodiments of the present invention.
Figure 4B:
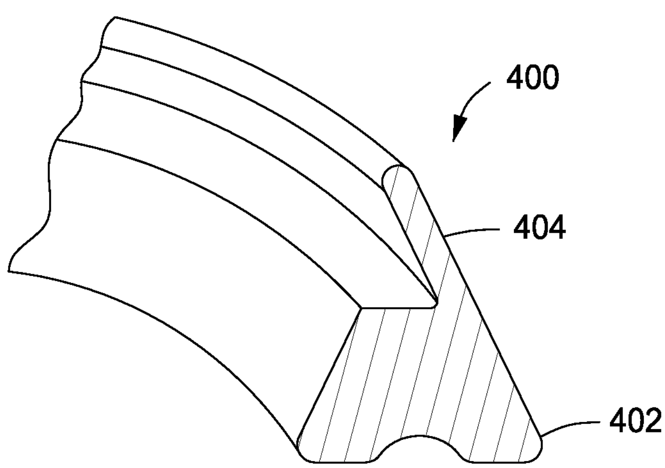

The sealing apparatus 400, disposed outside the injector pocket 104 to prevent processing chemicals in the process volume 237 and the inject volume 241 from escaping to the outer volume 238, is depicted in further detail in FIGS. 4A-B. The sealing apparatus 400 may include a body 402 and an arm 404 extending from the body 402. The body 402 and arm 404 may be fabricated from similar materials as discussed above with respect to the body 302 in FIGS. 3A-B. The sealing apparatus 400 may be advantageous for sealing large surfaces, for example, such as between a surface 406 of the rim 206 facing the injector assembly 105 and an interior surface 408 of the injector assembly 105. The interior surface 408 is disposed proximate a terminal end of the injector opening 216 and adjacent to the injector assembly facing surface 406.

The body 402 may be disposed in a recess 410 that may be formed in the injector assembly facing surface 406 of the rim 206. The recess 410 may be disposed about the injector pocket 104 (e.g., the recess 410 may circumscribe the injector pocket 104). The recess 410 may be formed with an outer opening that is smaller than an interior dimension of the recess, thereby forming a restriction that facilitates retaining the body 402 within the recess. The body 402 may be a closed loop structure having the same shape, of having a shape that may conform the same shape as the recess 410. For example, the body 402 may have an annular shape. However, non-annular shapes may also be utilized. The body 402 may have a cross-sectional shape that substantially conforms to a cross-sectional shape of the recess 410 to facilitate retaining the body 402 within the recess 410. As illustrated in FIG. 4A, the body 402 may be substantially disposed within the recess 410. While illustrated as a trapezoidal cross-section, the body 402 may have any suitable cross-section that substantially conforms to the cross-sectional shape of the recess 410. Suitable cross-sections of the body 402 may include square, rectangular, or the like. Alternatively, the body need not substantially conform to the shape of the recess 410 as discussed further below.

The arm 404 extends from the body 402, around the entire perimeter thereof, towards the interior surface 408 of the injector assembly 105. The arm 404 may be compressed towards the body 402 by the interior surface 408 of the injector assembly 105 when assembled. The arm 404, in response to compression by the interior surface 408, exerts a counterforce towards the interior surface 408. The arm 404 contacts the interior surface 408 with a force sufficient to form a seal between the injector assembly facing surface 406 and the interior surface 408. The arm 404 advantageously provides a substantially uniform force over a wide range of motion, which facilitates forming a uniform seal around the injector assembly 105 even in the presence of non-uniformities such as uneven distances between sealing surfaces due to machining or assembly tolerances. Thus, the counterforce exerted may permit the formation of a seal at such non-uniformities that conventional sealing apparatus, for example, such as o-rings would not allow.

Figure 4C:
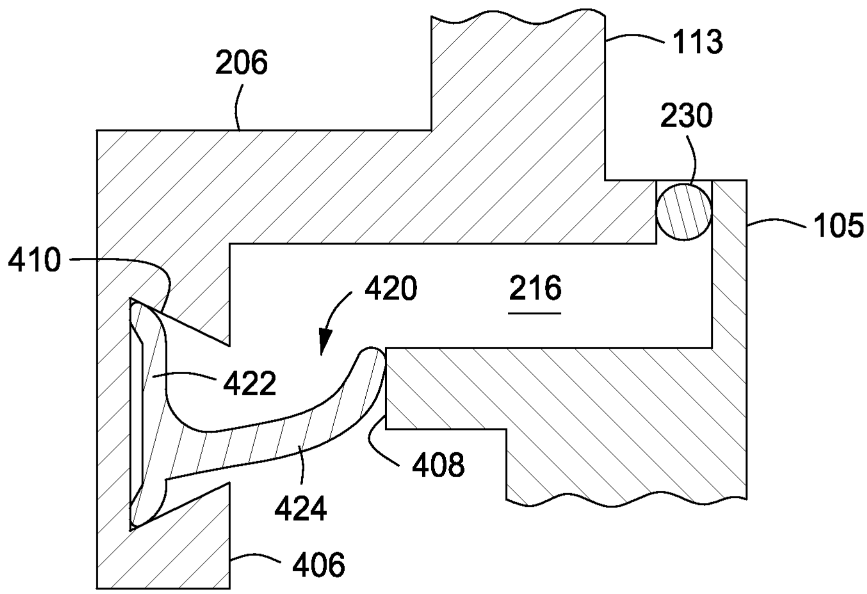
Figure 4D:
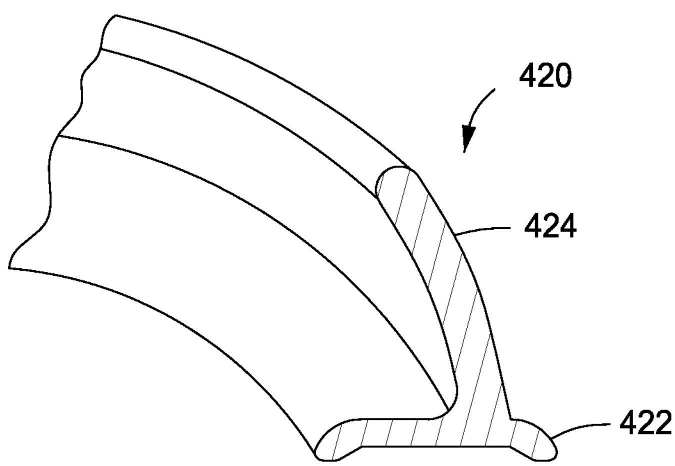

An alternative to the sealing apparatus 400 is illustrated in FIGS. 4C-D. The sealing apparatus 420 may include a body 422 and an arm 424. The body 422 and arm 424 may be comprise similar materials to the apparatus 400 as discussed above. The body 422 may have a cross-section that is substantially smaller than the cross-section of the recess 410. As illustrated in FIG. 4C, the body 422 may be entirely disposed within the recess 410. The arm 424 extends from the body 422 and towards the interior surface 408 of the injector assembly 105. Further, the arm 424 extends along the body 422, where the arm 424 has a closed loop structure. The arm 424 may be configured to be compressed towards the body 422 by the interior surface 408 of the injector assembly 105. As discussed above, the arm 424 may exert a substantially uniform counterforce on the interior surface 408 of the injector assembly 105 in response to a wide range of compression, and thus forms a seal between the injector assembly facing surface 406 and the interior surface 408.

Embodiments of sealing apparatus have been disclosed herein. In some embodiments, the sealing apparatus advantageously improves tolerance to misalignment and/or non-uniformities between sealing surfaces.

While the foregoing is directed to embodiments of the present invention, other and further embodiments of the invention may be devised without departing from the basic scope thereof.

The invention claimed is:

1. A substrate processing apparatus, comprising:
- an outer chamber having an opening;
- an injector assembly disposed through the opening in the outer chamber;
- a recess disposed in the outer chamber in a closed loop about the opening, wherein the recess has a trapezoidal cross-section tapering away from a bottom surface; and
- a sealing apparatus comprising:
- a continuous body forming a closed loop disposed in the recess, wherein the continuous body has a trapezoidal cross-section having a first side, an opposing second side, a bottom disposed between the first and second sides, and a third side opposite the bottom, wherein the first side, opposing second side, and bottom are at least partially disposed within the recess, and wherein the continuous body tapers away from the bottom surface of the recess; and
- an arm coupled to the third side of the continuous body proximate only the first side and extending away from the continuous body from the first side toward the second side such that the arm and the first side form a single continuous taper surface, the arm configured to provide a force when deflected towards the continuous body by the injector assembly to form a first seal between the outer chamber and the injector assembly.

2. The substrate processing apparatus of claim 1, wherein the continuous body and the arm of the sealing apparatus comprise a perfluoroelastomer.

3. The substrate processing apparatus of claim 1, wherein the closed loop is annular.

4. The substrate processing apparatus of claim 1, wherein the arm extends continuously along the continuous body.

5. The substrate processing apparatus of claim 1, wherein the continuous body has a cross-sectional shape that substantially conforms to a cross-sectional shape of the recess to facilitate retaining the continuous body within the recess.

6. The substrate processing apparatus of claim 1, wherein the continuous body is substantially disposed within the recess.

7. The substrate processing apparatus of claim 1, wherein the continuous body has a cross-section that is substantially smaller than a cross-section of the recess, and wherein the continuous body is entirely disposed within the recess.

8. The substrate processing apparatus of claim 1, wherein the bottom of the continuous body further comprises a recessed central portion disposed between outer portions of the bottom proximate the first and second sides.

9. A substrate processing apparatus, comprising:

a first chamber body defining a process volume and having a first opening within a first surface of the first chamber body;

a second chamber body disposed about the first chamber body and partially defining an outer volume between the first chamber body and the second chamber body, wherein the second chamber body comprises a second opening within a first surface of the second chamber body;

an injector assembly disposed through the second opening in the second chamber body and coupled to the first chamber body at the first opening to provide a flow of process gas to the process volume;

a recess disposed within the first surface of the second chamber body proximate the second opening and having a bottom surface facing a second chamber body facing surface of the injector assembly, wherein the recess forms a closed loop, wherein the recess has a trapezoidal cross-section tapering away from the bottom surface; and a sealing apparatus, comprising: a continuous body forming a closed loop and retained in the recess, wherein the continuous body has a trapezoidal cross-section having a first side, an opposing second side, a bottom disposed between the first and second sides, and a third side opposite the bottom, wherein the continuous body tapers away from the bottom, and wherein the continuous body is retained in the recess such that the bottom and the first surface of the first chamber body are substantially parallel; and an arm coupled to the third side of the continuous body proximate only the first side and extending from the continuous body away from the third side and toward the second side of the continuous body such that the arm and the first side from a single continuous taper surface, the arm configured to provide a force when deflected towards the continuous body by the injector assembly to form a first seal between the first surface of the second chamber body and the second chamber body facing surface of the injector assembly.

10. A substrate processing apparatus, comprising:

(a) a first chamber body disposed about a second chamber body, the first chamber body comprising:

(i) a first surface;

(ii) a recess disposed in the first surface, wherein the recess forms a closed loop and wherein the first surface extends in opposite directions from a first side of the recess and a second side of the recess, and wherein the recess has a trapezoidal cross-section that tapers away from the first surface;

(iii) a second surface coupled to the first surface, wherein the second surface is substantially perpendicular to the first surface; and (iv) a third surface coupled to the second surface, wherein the third surface is substantially perpendicular to the second surface;

(b) an injector assembly disposed through an opening in the first chamber body and coupled to the second chamber body, comprising:

(i) a fourth surface facing the recess in the first surface;

(ii) a fifth surface opposing the second surface and coupled to the fourth surface, wherein the fifth surface is substantially perpendicular to the fourth surface; and (iii) a sixth surface opposing the third surface and coupled to the fifth surface, wherein the sixth surface is substantially perpendicular to the fifth surface; and (c) a first sealing apparatus, comprising:

(i) a first continuous body that forms a closed loop, wherein the first continuous body has a trapezoidal cross-section having a first side, an opposing second side, a bottom disposed between the first and second sides, and a third side opposite the bottom, wherein the continuous body tapers away from the bottom, and wherein the first continuous body is retained in the recess of the first surface such that the bottom and the first surface are substantially parallel; and (ii) an arm coupled to the third side of the first continuous body proximate only the first side and extending from the first continuous body away from the third side and toward the second side of the first continuous body such that the arm and the first side from a single continuous taper surface, the arm configured to provide a force when deflected towards the first continuous body by the fourth surface to form a first seal between the first surface and the fourth surface.

11. The substrate processing apparatus of claim 10, further comprising a second sealing apparatus comprising a second continuous body forming a closed loop and disposed between the third surface and the sixth surface to form a second seal between the third surface and the sixth surface, wherein the first seal and the second seal form a first closed volume between the first seal and second seal, and wherein the second seal is formed substantially parallel to the first seal.

12. The substrate processing apparatus of claim 10, wherein the first continuous body and the arm of the first sealing apparatus comprise a perfluoroelastomer.

13. The substrate processing apparatus of claim 10, wherein the first continuous body forms a annular closed loop.

14. The substrate processing apparatus of claim 10, wherein the arm extends continuously along the first continuous body.

15. The substrate processing apparatus of claim 10, wherein the first continuous body has a cross-sectional shape that substantially conforms to a cross-sectional shape of the recess to facilitate retaining the first continuous body within the recess.

16. The substrate processing apparatus of claim 10, wherein the first continuous body is substantially disposed within the recess.

17. The substrate processing apparatus of claim 10, wherein the first continuous body has a cross-section that is substantially smaller than a cross-section of the recess, and wherein the first continuous body is entirely disposed within the recess.

18. The substrate processing apparatus of claim 10, wherein the bottom of the first continuous body further comprises a recessed central portion disposed between outer portions of the bottom proximate the first and second sides.

* * * * *